United States Patent [19]
Gordon et al.

[11] Patent Number: 5,650,628
[45] Date of Patent: Jul. 22, 1997

[54] SIMULTANEOUS DEFLECTIONS IN CHARGED-PARTICLE BEAMS

[75] Inventors: Michael Stuart Gordon, Mt. Kisco, N.Y.; Donald F. Haire, Raleigh, N.C.; Paul Francis Petric, Brewster; James Donald Rockrohr, Hopewell Junction, both of N.Y.

[73] Assignee: International Business Machines Corporation, Armonk, N.Y.

[21] Appl. No.: 356,433

[22] Filed: Dec. 15, 1994

[51] Int. Cl.[6] .................................. H01J 37/145
[52] U.S. Cl. ........................... 250/398; 250/396 R
[58] Field of Search ................. 250/396 R, 396 ML, 250/398

[56] References Cited

U.S. PATENT DOCUMENTS

| | | | |
|---|---|---|---|
| 3,801,784 | 4/1974 | Wittry | 250/396 R |
| 4,870,286 | 9/1989 | Tobuse | 250/398 |
| 4,881,015 | 11/1989 | Shimoma et al. | 315/371 |
| 5,051,556 | 9/1991 | Sakamoto et al. | 250/396 ML |
| 5,177,412 | 1/1993 | Morohashi et al. | 315/370 |
| 5,285,074 | 2/1994 | Haire et al. | 250/396 ML |

*Primary Examiner*—Bruce Anderson

[57] ABSTRACT

A charged particle beam is controlled by two pairs of deflectors that adjust the beam through two or more deflection centers, thereby saving cost and space and reducing system noise. The mathematics of the superposition of signals and, therefore, of the deflecting fields provide orthogonality of the adjustments so that all adjustments are independent of each other.

11 Claims, 5 Drawing Sheets

SIMULTANEOUS DEFLECTIONS IN CHARGED-PARTICLE BEAMS

TECHNICAL FIELD

The field of the invention is that of charged-particle beams, such as are used in electron microscopes, electron beam systems for integrated circuit lithography, ion beam systems, video cameras and displays and the like.

BACKGROUND OF THE INVENTION

In transporting charged-particle beams it is often necessary to "steer" or guide the beam through, for instance, beam-defining apertures using magnetic deflection yokes or electric deflectors. In most charged particle systems, there is an alignment scheme consisting of either a single (or multiple) electric or magnetic deflectors as described below. This disclosure applies to either electric or magnetic deflectors.

The path that a charged-beam particle follows through a deflector is governed by the Lorentz equation $\vec{F}=q(\vec{E}+\vec{V}/c\times\vec{B})$, where $\vec{E}$ and $\vec{B}$ are the electric and magnetic fields, $\vec{V}$ is the particle's velocity, and q is the charge of the particle. For positively-charged particles, the force is in the same direction as the electric field, and in the case of a magnetic field, it is in a direction mutually perpendicular to the particle's velocity and the magnetic field. The particle's trajectory, governed by these forces, is parabolic in the field. Outside of the field, the trajectory follows a tangential path.

If one follows the trajectory of a charged-particle beam traveling through a single uniform deflector and connects the tangents of the trajectory before and after the deflection, they meet on the axis in the symmetry plane along the axis of the deflector. The beam bundle appears to pivot or be deflected from this point.

A pair of deflectors can be used to deflect a charged particle beam such that the beam appears to be deflected from any point controlled by the relative strengths of the two deflectors, referred to as the deflection center. For instance, in the case of two identical deflectors connected in series, the beam appears to be deflected from the center of the deflector pair. If they are connected in the opposite sense, the beam appears to be deflected from infinity. By varying the relative strength of the two deflectors, the deflection can be made to appear to come from anywhere above or below the deflector pair as shown in T. V. Landon et al., IBM Technical Disclosure Bulletin, July 1976, Vol. 19., No. 2, 464.

In the past, one pair of deflectors was used to generate each deflection center positioned arbitrarily along the axis.

SUMMARY OF THE INVENTION

The invention relates to an apparatus and method that allows a single pair of deflectors to act as two or more pairs, with each pair having a unique deflection center and gain adjustable along the axis.

In a case of great utility, a single pair can direct the beam to intersect a reference plane at a particular point and also to pivot the beam about that point.

DETAILED DESCRIPTION

Figure 1:
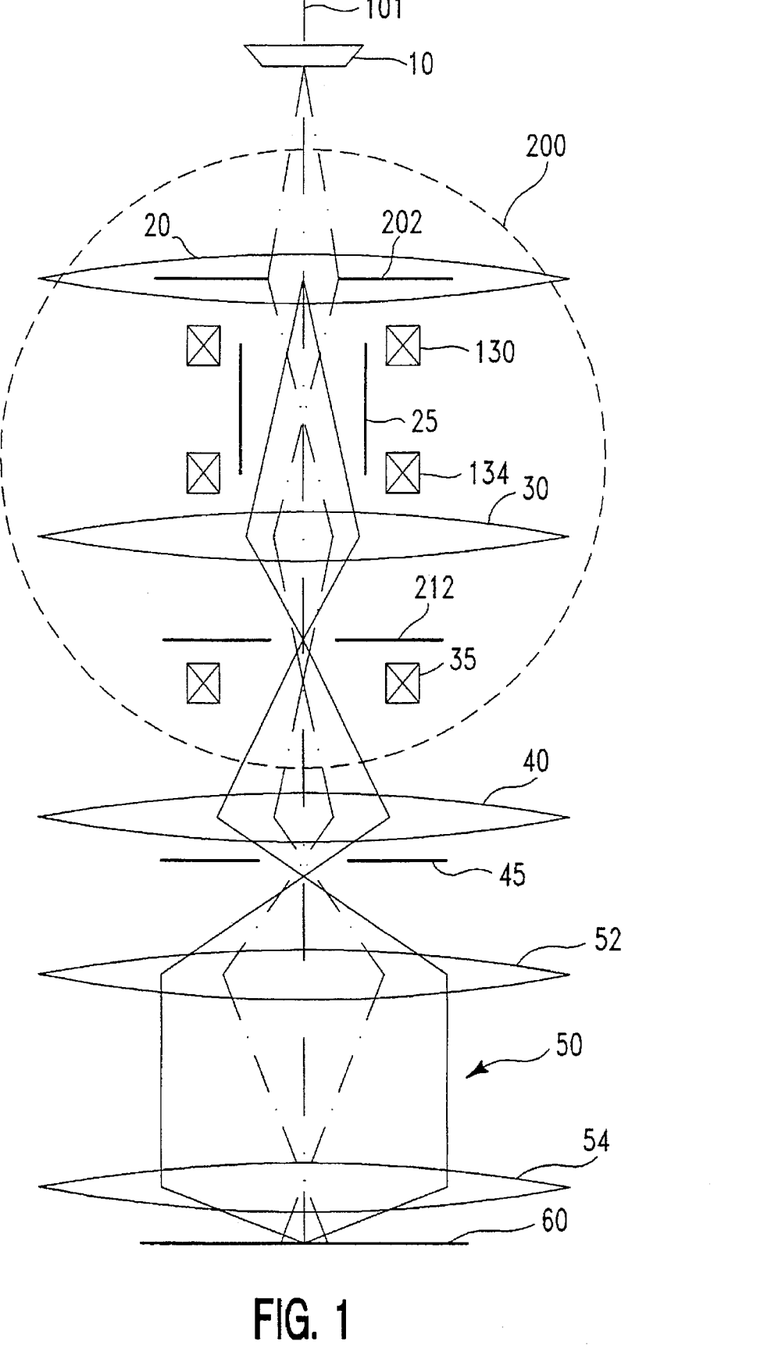
FIG. 1 illustrates in partially pictorial, partially schematic form a system employing the invention.

A simplified system for generating and employing a shaped electron beam (or charged-particle beam) that is used to write a pattern on a wafer and employs a pair of coils according to the invention is illustrated in FIG. 1. In this system an electron beam is emitted from source 10 and travels downward along axis 101. The beam enters shaping section 200 bounded by aperture plates 202 on the top and 212 on the bottom. Within the shaping system is an upper deflector 130 and a lower deflector 134 capable of deflecting the beam in the X and Y directions; the construction and geometry of the deflector to generate such deflection fields are well known.

Figure 2:
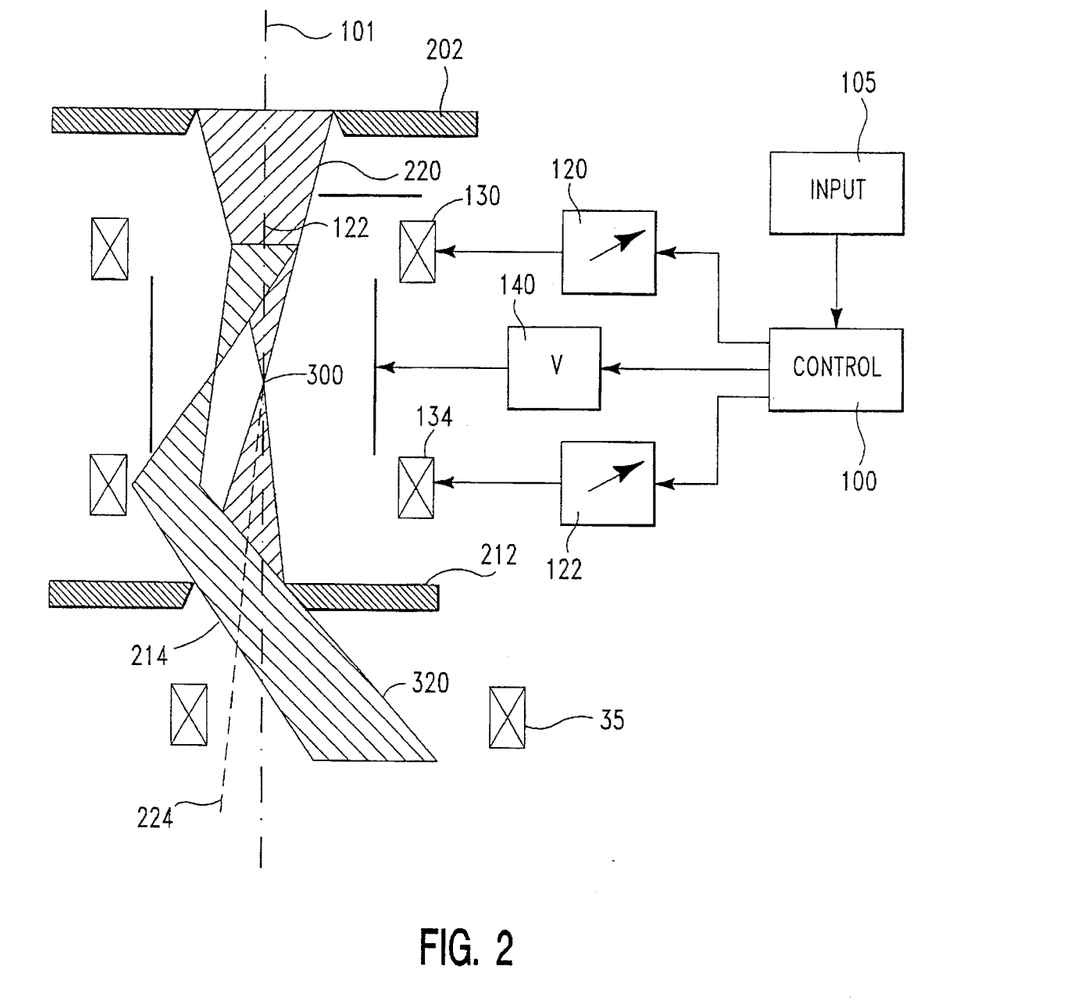
FIG. 2 illustrates a portion of FIG. 1 in more detail, including beam defection.

In FIG. 2, current flows through the alignment coils, heretofore referred to as deflectors, from current sources 120 and 122, respectively that, in turn, are controlled by controller 100. Controller 100 is illustratively a general purpose computer receiving input from input means 105, which can be a touch-screen cathode ray tube or a keyboard. Controller 100 generates signals controlling the output of the deflector pairs $X_u$, $Y_u$, $X_l$, $Y_l$ (where the subscripts u, l refer, respectively, to upper, lower) so that the operator may vary one parameter of the system without having to engage in a manual recalculation of the correct changes to all four signals in order to keep other beam parameters constant.

In the example illustrated, beam 220 enters from above, along axis 101, traveling along line 222. Through the combination of the upper and lower alignment coils, 130 and 134, respectively, the beam can be made to appear to be deflected from point 300, between deflectors 130 and 134. The beam can be steered through the center of the aperture plate 212, as it travels along line 224. The beam can be made to pass through the center of a focus element 35, downstream of the lower aperture plate 212, without disturbing the alignment of the beam with respect to the lower aperture by pivoting the beam about the center of the lower aperture plate 212, as shown by 320.

In the prior art, it would have been necessary to use two pairs of deflectors to accomplish the result illustrated here, with a pair performing each function.

Our invention involves the superposition of electronic signals to make a pair of deflectors appear as any number of deflectors; i.e. two deflector pairs can have two or more deflection centers and separate gains. The deflectors are referred to as "upper" and "lower" the notation referring to being closer or further away from the source of the electron beam. In the description that follows, several variables are discussed, and figures are given to describe the variables.

In the remainder of the system shown in FIG. 1, demagnification lens 40 focusses the beam through beam limiting aperture 45, from which it passes through VAIL lens 50, described in U.S. Pat. No. 4,376,249, comprising upper and lower lenses 52 and 54 that perform the final focus on target 60. Target 60 may illustratively be a photosensitive surface that records the series of shaped beam exposures defined in shaping section 200 for the purpose of making a reticle for an optical stepper used in integrated circuit manufacturing or any other suitable purpose.

TABLE I

Variables:

| | |
|---|---|
| a | upper height gain (ratio of upper height gain to lower height gain controls the deflection center of the deflector pair - range +1.0 to −1.0) |
| d_a | upper delta height gain (adjustment to a to account for any asymmetry between X and Y effects.) |
| c | lower height gain (ratio of upper height gain to lower height gain controls the deflection center of the deflector pair - range +1.0 to −1.0) |
| d_c | lower delta height gain (see d_a) |
| e | X upper deflector gain (−1 < gain < +1) |
| f | Y upper deflector gain (−1 < gain < +1) |
| g | X lower deflector gain (−1 < gain < +1) |
| h | Y lower deflector gain (−1 < gain < +1) |
| UR | upper deflector rotation (x and y) |
| LR | lower deflector rotation (x and y) |
| d_UR | orthogonality of upper deflector (y vs x) |
| d_LR | orthogonality of lower deflector (y vs x) |
| GR | Global rotation (rotation of both upper and lower deflectors) |
| Xin | X input to the deflector pair |
| Yin | Y input to the deflector pair |
| Xu | output excitation to X upper deflector |
| Yu | output excitation to Y upper deflector |
| Xl | output excitation to X lower deflector |
| Yl | output excitation to Y lower deflector |

SEPARATE ROTATION

The upper and lower deflectors can be individually electronically rotated and the current distribution in the X-Y plane, or the orthogonality (meaning a correction to equalize the effect of the X and Y deflections) adjusted. This can be accomplished as follows: the beam is raster scanned by the deflector over a target of known dimensions and whose features the deflection is desired to be aligned to, for instance a square or cross. A conventional real-time 2-dimensional display ( such as a vidicon, CRT) provides feedback for this adjustment. The variables UR, LR, d_UR and d_LR can be determined by correcting the scan image as seen in FIG. 3.

Figure 3A:
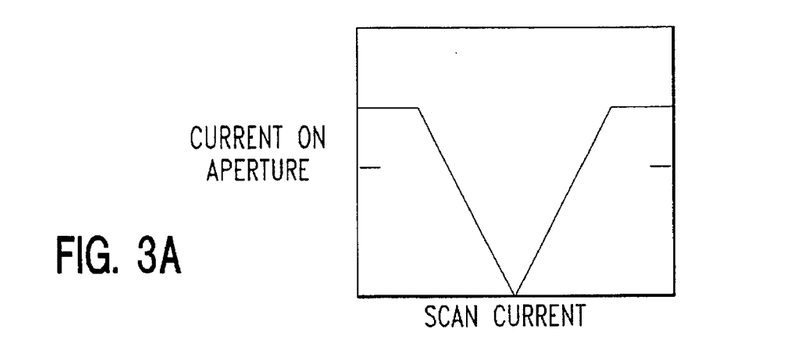
FIG. 3 shows plots of current versus a parameter for various steps in the alignment process.

FIG. 3a illustrates a plot of the current striking an aperture plate, such as plate 212, as a function of the excitation of the relevant deflector. When the beam is centered, the current striking the plate is at a minimum. Such a scan is the standard test for beam alignment.

Figure 3B:
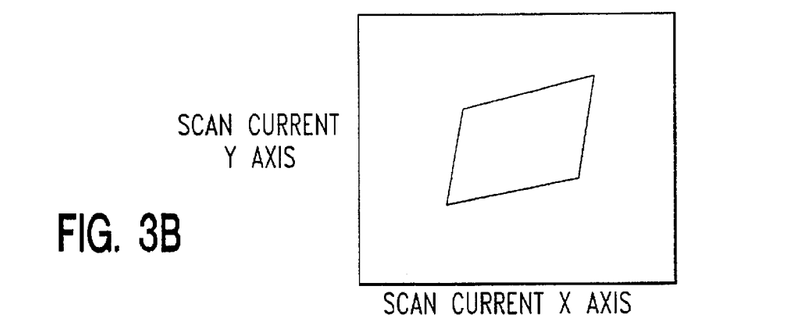
Figure 3C:
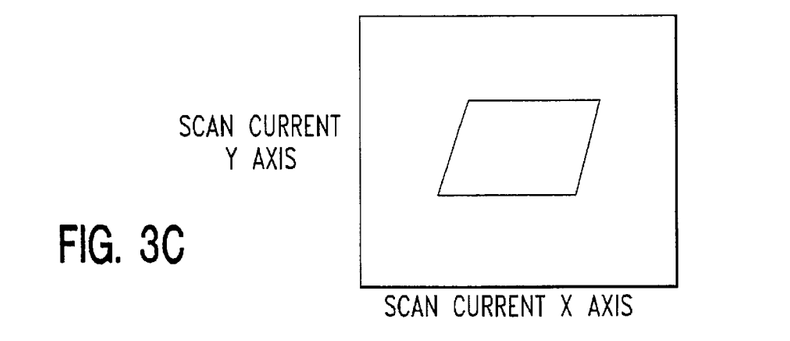
Figure 3D:
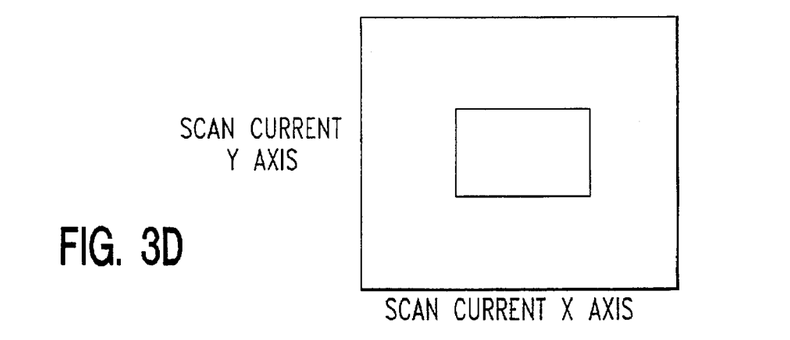

FIG. 3b illustrates an x-y plot of the beam passing through, or backscattered from a nominally, but not necessarily, square target. The target could be a hole in the plate, metalized features on a silicon wafer or silicon membrane. For alignment purposes, a real-time detector is preferred, of course. As can be seen, the nominally square image is rotated and is a parallelogram. FIG. 3c illustrates the same plot after adjustment for rotation, in which the nominally horizontal edges of the parallelogram are made to be horizontal. The adjustment may be carried out by changing the rotation applied to the beam by the deflector. The mathematics to carry out this change is discussed below. During this operation, the total current will change and the position of the beam in the X-Y plane will move. Those skilled in the art will appreciate that it may be necessary to back up and realign the beam to center the beam through the apertures. In a preferred embodiment, a conventional servo loop responds to the current in plate 212 to control deflectors 130, 134 to keep the beam centered in aperture 214. FIG. 3d illustrates the same plot after adjustment for orthogonality (differential rotation caused by the X and Y deflectors not being precisely orthogonal).

GAIN

A gain balance can be used to make both axes of a deflector have identical sensitivities, and to match the sensitivities of both deflectors in a two-deflector pair. This determines the variables e,f,g and h, as seen in FIG. 3d, in which the current in the X and Y coils is adjusted to make the image square. A square image may not be required in many applications, however, the gains should be adjusted so that the horizontal and vertical images on the x-y plot match in ratio the objects.

After rotation, orthogonality and gain adjustments, the deflection produced by the first upper deflector produces a beam deflection that matches the target. The second deflector in the pair could be similarly adjusted and if desired the gain (deflection size) could match that of the first deflector.

HEIGHT GAIN

The height gain determines the point from which the beam appears to be deflected. The deflection can appear to come from well above the upper deflector to well below the lower deflector, simply by changing the ratio of the height gains (ratio of input signal) supplied to the upper vs. the lower deflector. This determines the variables a, d_a, c, and d_c. This is often useful when the deflectors cannot be physically located near the desired deflection center, or multiple deflection centers at widely different positions are desired.

GLOBAL ROTATION

The global rotation is used to electronically rotate the deflector pair, while preserving the height gains, rotation, orthogonality, and gains of the individual deflectors. This global rotation might be necessary if a magnetic lens were adjusted below the deflector pair which would rotate the direction of deflection. This determines the variable GR.

The mathematics involved in this algorithm involves a series of matrix operations. The product of the matrices provides, as will be shown, the connection between functions in the algorithm.

Figure 4A:
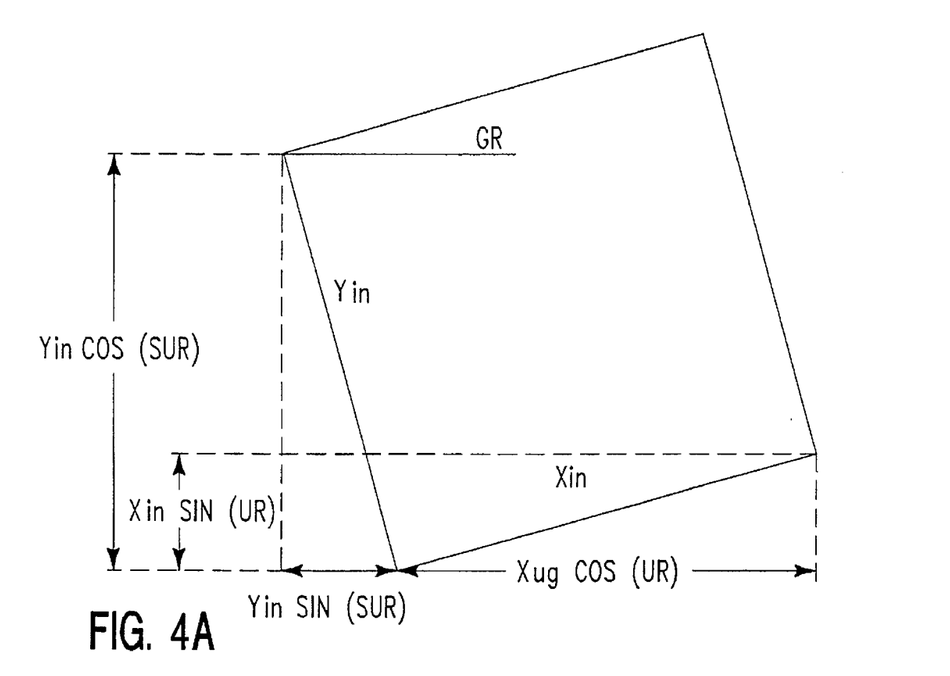
FIG. 4 shows components of global rotation and the contribution to separate/rotations of the orthogonality correction term.
Figure 4B:
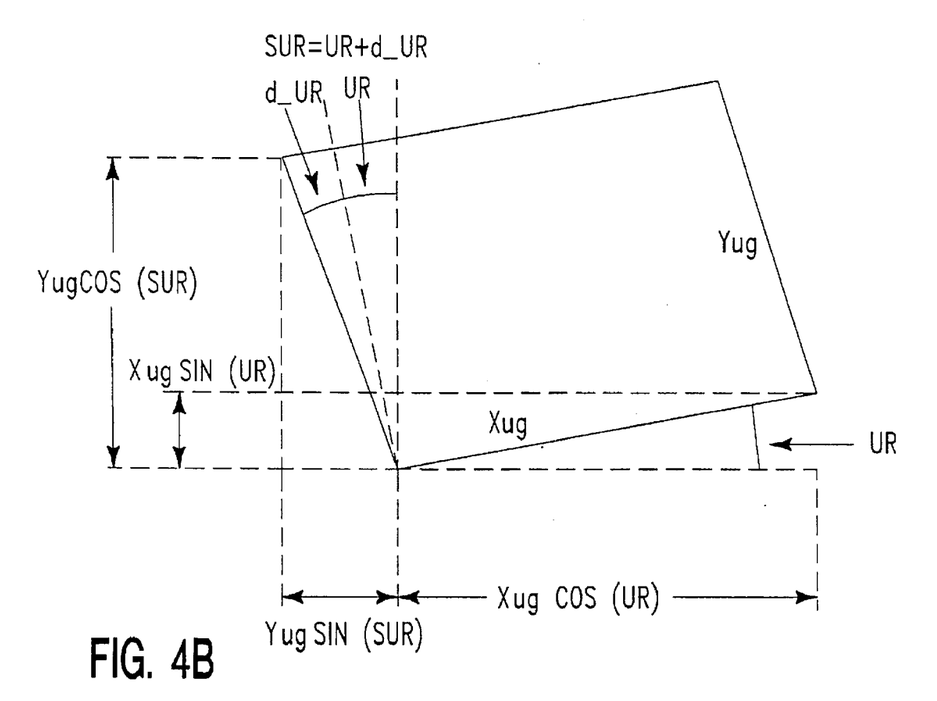

The GLOBAL ROTATION matrix, Mgr, operating on the input signals Xin, and Yin is:

$$\begin{bmatrix} Xgr \\ Ygr \end{bmatrix} = \begin{bmatrix} \cos(GR) & -\sin(GR) \\ \sin(GR) & \cos(GR) \end{bmatrix} \begin{bmatrix} Xin \\ Yin \end{bmatrix}$$

and is shown in the upper portion of FIG. 4.

The HEIGHT GAIN matrix, Mh, acts on the resultant of the global rotation operation:

$$\begin{bmatrix} Xuh \\ Yuh \\ Xlh \\ Ylh \end{bmatrix} = \begin{bmatrix} A & 0 \\ 0 & B \\ C & 0 \\ 0 & D \end{bmatrix} \begin{bmatrix} Xgr \\ Ygr \end{bmatrix}$$

where:

A=a

B=a+d_a

C=c

D=c+d_c and the subscripts u and l refer to upper and lower, respectively.

The GAIN matrix, Mg, acts on the resultant of the height gain operation:

$$\begin{bmatrix} Xug \\ Yug \\ Xlg \\ Ylg \end{bmatrix} = \begin{bmatrix} e & 0 & 0 & 0 \\ 0 & f & 0 & 0 \\ 0 & 0 & g & 0 \\ 0 & 0 & 0 & h \end{bmatrix} \begin{bmatrix} Xuh \\ Yuh \\ Xlh \\ Ylh \end{bmatrix}$$

Finally, the SEPARATE ROTATION matrix, Msr, acts on the resultant of the gain operation as:

$$\begin{bmatrix} Xur \\ Yur \\ Xlr \\ Ylr \end{bmatrix} = \begin{bmatrix} \cos(UR) & -\sin(SUR) & 0 & 0 \\ \sin(UR) & \cos(SUR) & 0 & 0 \\ 0 & 0 & \cos(LR) & -\sin(SLR) \\ 0 & 0 & \sin(LR) & \cos(SLR) \end{bmatrix} \begin{bmatrix} Xug \\ Yug \\ Xlg \\ Ylg \end{bmatrix}$$

here: SUR=UR+d_UR, and SLR=LR+d_LR. This is shown schematically in the lower portion of FIG. 4.

The overall matrix operation is the product of the 4 matrices given above $$\begin{bmatrix} Xu \\ Yu \\ Xl \\ Yl \end{bmatrix} = M \begin{bmatrix} Xin \\ Yin \end{bmatrix}$$

where:

M=Msr•Mg•Mh•Mgr or $$M = \begin{bmatrix} p1 & p2 \\ p3 & p4 \\ p5 & p6 \\ p7 & p8 \end{bmatrix}$$

finally:

p1=A*e*cos(UR)*cos(GR)−B*f*sin(SUR)*sin(GR)
p2=−A*e*cos(UR)*stn(GR)−B*f*sin(SUR)*cos(GR)
p3=A*e*sin(UR)*cos(GR)+B*f*cos(SUR)*sin(GR)
p4=−A*e*sin(UR)*sin(GR)+B*f*cos(SUR)*cos(GR)
p5=C*g*cos(LR)*cos(GR)−D*h*sin(SLR)*sin(GR)
p6=−C*g*cos(LR)*sin(GR)−D*h*sin(SLR)*cos(GR)
p7=C*g*sin(LR)*cos(GR)+D*h*cos(SLR)*sin(GR)
p8=−C*g*sin(LR)*sin(GR)+D*h*cos(SLR)*cos(GR)

Once all of these terms are determined experimentally, the actual signals that flow through the individual deflectors (Xu, Yu, Xl, Yl) in response to a desired input "signals" (Xin, Yin) are determined by the above formulae.

In controlling the system, the operator employs a "touch-screen" system (or keyboard) that accepts as inputs variables listed in Table I. This input changes one or more of any of the matrices and also divides the total current in accordance with these matrices to drive the individual coils.

For the case where the deflector pair is to be used to provide a second deflection center, a separate set of a, d_a, c, and d_c parameters need to be defined. A new set of p1–p8 parameters (defining a new matrix M2) are then computed, and separate Xin2 and Yin2 values are used for the second deflection function. Finally the $Xu_2$, $Yu_2$, $Xl_2$, and $Yl_2$ signals are summed to the original Xu, Yu, Xl, and Yl values and sent to the deflectors. This superposition works for n distinctly different deflection centers per deflector pair.

An example of the use of this superposition is shown for a simplified example in FIG. 2, which is a detailed schematic diagram of a shaping section of an electron-beam shaped-beam lithographic system from FIG. 1. Such systems are well known in the art, as described by Pfeiffer (J. Vac. Sci. Technol., 15 (3) May/June 1978, 887). This shaping concept will only be described here briefly.

An upper aperture, consisting of a single or series of holes or features, is electron-optically imaged onto a lower aperture, consisting of single or multiple features by an electron lens 30. Shaping plates 25, having a voltage determined by voltage driver 140 under control of controller 100 are used to deflect the image of the upper aperture over the lower aperture. Features of various sizes and geometries can be written in a single exposure, and larger features can be made up of multiple displaced exposures.

As those skilled in the art recognize, the source image of the linked-beam trace is usually imaged onto a beam-limiting aperture to limit the geometric aberrations. So as not to change the current density of the shaped spot, the deflection center of the shaping system is designed to coincide with the conjugate image of the source.

FIG. 2 shows two functions that might be desired, as an example, to align an electron beam in the shaping section of the electron beam lithography system shown schematically in FIG. 1. Two separate, and independent, alignment features are shown in FIG. 2; the alignment coils given by 130 and 134 provide the beam's deflection.

In the first function, the deflection center of the alignment coil pair is adjusted to coincide with the deflection center of the shaping plates 25, and the Xin and Yin for this function are used to center the beam in the lower aperture 214.

In the second function, which doesn't perturb the first, the deflection center of the alignment coil pair is adjusted to coincide with the plane of the lower aperture 214. The application of another set of Xin and Yin for this function can be used to align the beam into a target below the lower aperture, such as the focus coil shown by 35, but will not change the beam's centering onto the lower aperture.

Those skilled in the art will readily appreciate that this arrangement allows for two separate alignments which in prior art would have required another pair of alignment coils.

The following illustrates a systematic procedure to calibrate the operating parameters in the M matrix above. Those skilled in the art will appreciate that other methods can be used to give equivalent results.

COLUMN CONTROL SETUP

In the preferred embodiment the following screens on the input device 105 to the controller 100 are available to adjust the relevant parameters. The subscripts 1 and 2 refer to the two functions adjusted by the one pair of deflectors—(alignment coils in this example).

(1) upper theta, delta theta (upper coil only powered)
(2) lower theta, delta theta (lower coil only powered)
(3) upper gain x, y (upper coil only powered)
(4) lower gain x, y (lower coil only powered)
(5) height gains, upper/input, lower/input (both coils powered)
(6) delta $height_1$, gain upper/input, lower/input (both coils powered)
(7) height $gain_2$, upper/input, lower/input (both coils powered)
(8) offset $delta_2$, height gain upper/input, lower/input (both coils powered)

$Xin_1$, $Yin_1$, $Xin_2$ and $Yin_2$ are controlled from screens 5–8 too.

As shown above, the first four screens are used by an operator to adjust parameters associated with the upper and lower coils, separately. In practice, the variables associated with the coil not being adjusted (i.e., the lower coil when the rotation of the upper coil is being adjusted) are zeroed in the matrices described earlier. In this context, there is a single Xin, and Yin which operates on the matrix M to adjust the beam's position.

For instance, the matrices reduce to the following, for the first screen:

$$\begin{bmatrix} Xu \\ Yu \end{bmatrix} = \begin{bmatrix} \cos(UR) & -\sin(SUR) \\ \sin(UR) & \cos(SUR) \end{bmatrix} \begin{bmatrix} Xin \\ Yin \end{bmatrix}$$

When using the last four screens, the two coils are powered together and the 1 and 2 subscripts are used to generate two sets of matrices as discussed earlier. The variables determined from the first four screens are used as input to these new matrices. The following procedure may be used for the system of FIG. 1, in which it is desired to adjust two heights of beam deflection centers.

It is assumed that upper and lower apertures have been properly aligned, i.e., that they are aligned with respect to the target axes.

Upper separate rotation: (FIG. 3, used to determine UR, d_UR)

a) Scan one axis (Xin or Yin) of upper alignment coil 132, view current on lower aperture as a function of the scan. (FIG. 3a)

Adjust dc offset so scan appears centered.

b) Scan other axis of upper alignment coil, view current on lower aperture as a function of the scan.

Adjust dc offset so scan appears centered.

Display 2-dimensional view of aperture. (FIG. 3b)

c) Adjust theta, (UR), so that the top and bottom edges of the square are horizontal.

During this procedure, Xin and Yin are swept about separate, and fixed, DC offsets determined as explained above. As shown by the modified matrix above, the currents going to the upper coil as modified by the calculations in the controller will change Xu and Yu, and therefore it might be necessary to readjust the DC offsets to keep the 2-dimensional display centered.

d) Adjust delta theta, d_UR, so that left and right edges are vertical. (Here also, it might be necessary to readjust the dc offset). (FIG. 3d)

Lower separate rotation: (Used to determine LR, d_LR)

Repeat the steps above, using the lower coil 134 instead of the upper.

Figure 5A:
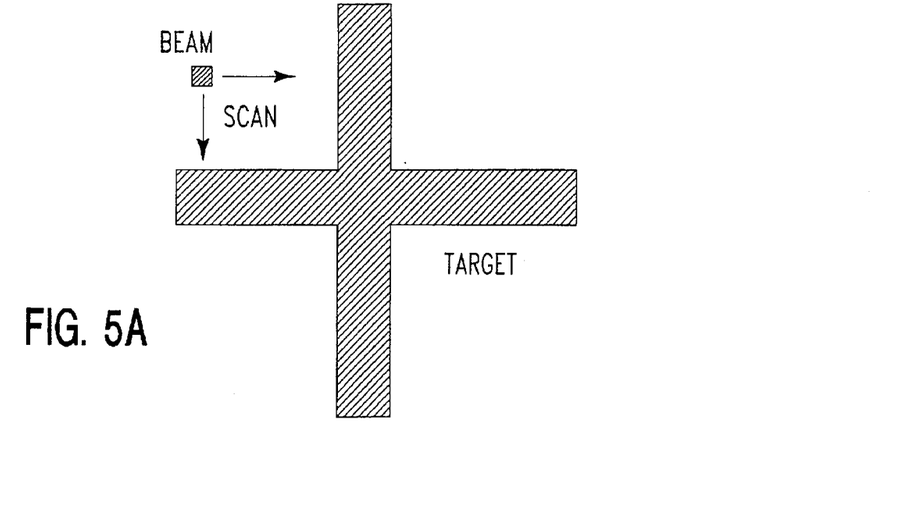
FIG. 5 shows the process of scanning across a target and associated current plots.
Figure 5B:
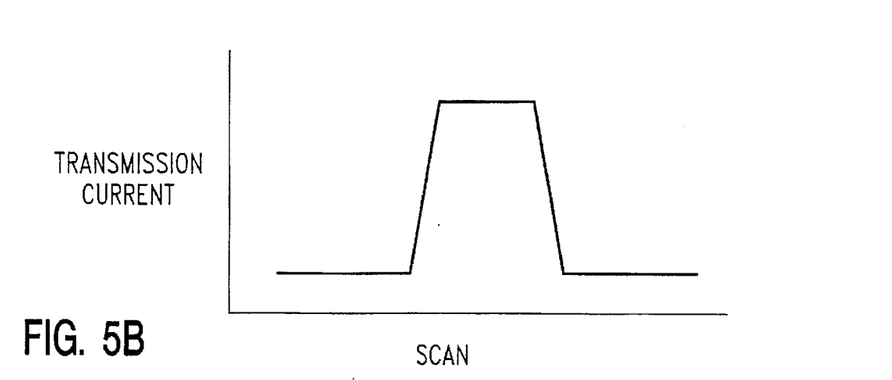

Upper gain: (FIG. 5, used to determine e and f)

a) Align beam through apertures to target.

b) Scan beam over target and display transmission or backscattered signal (depending on whether the detector can be placed behind the target or must be placed upstream as a function of the scan. Display both axes. (FIG. 5a and 5b)

c) Check both axes of the alignment coil polarity by observing the motion of the target feature in the bidirectional scan for an increase in signal (of the coil) to the motion of a known reference (another deflector, stage motion, etc).

Figure 5C:
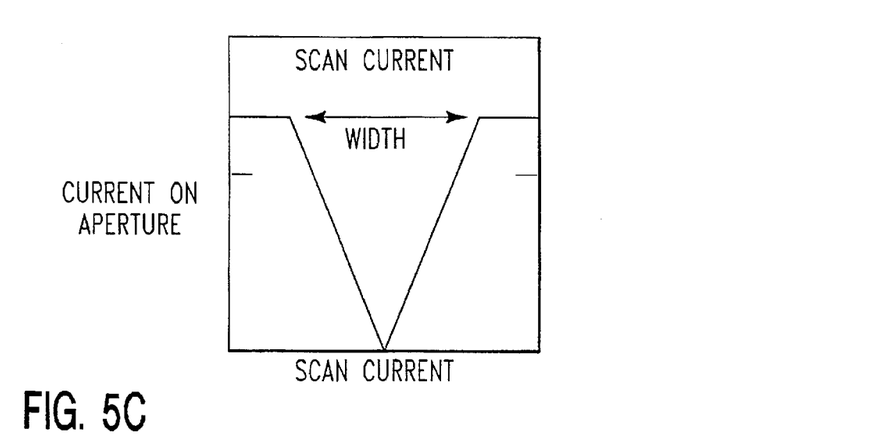

The polarity of the alignment coil can be reversed by changing the sign of the gain.

d) Scan one axis of upper alignment coil, view current on lower aperture as a function of the scan. (FIG. 5c)

e) Measure the current required to scan across the aperture.

Repeat for other axis of the upper deflector.

Decrease the gain of the axis whose scan was the narrower, until the width of the aperture is identical for both the scans of both axes. The parameters e and f, X upper and Y upper gains, respectively, are set by this procedure.

Lower gain: (Used to determine g, h)

Repeat the steps above, using the lower coil instead of the upper.

If desired, the sensitivity of the lower coil (x or y) could be made to match that of the upper coil.

Height gain 1: (Used to determine A, B, C and D)

Height gain 1 is set up so that the alignment coil's deflection center is imaged into the beam limiting aperture below.

Set the height gain to upper/input=1 and lower/input=1, parameters a, c.

Scan the x axis of the alignment coil pair ($Xin_1$).

View the current on the beam limiting aperture as a function of the scan.

The height gain is setup correctly when there is no increase in current on the beam limiting aperture when scanning $Xin_1$. (There will be, however, a decrease, due to the beam being "shaped" by the lower shaping aperture).

Delta height gain 1: (Parameters d_a, d_c)

Repeat above procedure, except scan in the y axis ($Yin_1$) and adjust the delta height gain 1 so that the y axis of deflection is properly imaged into the beam limiting aperture.

$Xin_1$ and $Yin_1$:

These are adjusted so that the beam is centered in the lower shaping aperture.

Height gain 2: (Parameters $A_2$, $B_2$, $C_2$, $D_2$)

Set the height gain 2 to that computed from geometry so that the beam appears to be deflected about the lower shaping aperture.

Scan the x axis of the alignment coil pair ($Xin_2$).

View the current on the lower shaping aperture as a function of the scan.

The height gain 2 is set correctly when there is no change in the current intercepted on the lower shaping aperture when scanned.

Delta height gain 2: (Parameters d_$a_2$, d_$c_2$)

Repeat above procedure, except scan in the y axis ($Yin_2$) and adjust the delta height gain 2 so that the beam appears to be deflected about the lower shaping aperture.

$Xin_2$ and $Yin_2$:

These are adjusted so that the beam is centered within a focus coil below the lower shaping aperture.

Sweep the focus coil and simultaneously scan the beam over the target (as outlined earlier).

Any motion at the target caused by this sweep can be eliminated by adjusting $Xin_2$ and $Yin_2$.

In the operation of the system, after setup, the matrices M are held constant. The beam will preferably be monitored, and dynamically aligned, by the use of the current intercepted by aperture plates such as 202, 212 and 45 in order to keep the beam centered in spite of beam drift caused by charging, changes in the tool's magnetic environment, and the like. The inputs, Xin and Yin, are adjusted dynamically to keep the beam aligned through the electron beam column. For the example shown in FIG. 2, both or either of $Xin_1$, $Yin_1$ or $Xin_2$, $Yin_2$ could be servoed in the fashion described above.

Those skilled in the art recognize that although not necessary to the successful implementation of this invention, the M matrices could also be dynamically adjusted to correct for, for instance, needed higher-order corrections (for instance if distortion in the deflector causes UR to be a function of $Xin_1$).

Those skilled in the art will appreciate that, although the invention has been described in terms of a shaped E-beam system for writing directly on a wafer, or X-ray membrane, or nX masks, the invention can also be applied to E-beam systems that use reticles for projection lithography, for electron microscope systems, for ion beam systems, for systems that use electrostatic deflection instead of magnetic deflection and the like.

We claim:

1. A lithography system for directing a charged particle beam on a workpiece, comprising:

a beam source for generating and directing said beam along a system axis;

a beamshaping aperture plate disposed about said system axis for impressing an initial beam shape, having an initial azimuthal angle, on said beam;

an upper pair of deflector coils including an upper x coil and an upper y coil disposed about said system axis below said beamshaping aperture plate and connected to first and second controllable current supplies;

a lower pair of deflector coils including a lower x coil and a lower y coil disposed about said system axis, displaced along said system axis from said upper pair of coils and connected to third and fourth controllable current supplies;

control means connected to said first and second controllable current supplies for controlling the amount of current supplied by said current supplies to said upper and lower pair of coils;

focus means for focusing said beam on said workpiece; and     input means connected to said control means for passing to said control means desired parameters; in which     said control means controls said first, second, third, and fourth current supplies by means of first, second, third, and fourth control signals to divide a total x current and a total y current into an upper x current supplied to said upper x coil, an upper y current supplied to said upper y coil, a lower x current supplied to said lower x coil, and a lower y current supplied to said lower y coil, in accordance with said set of stored parameters; and     said control means includes at least three sets of stored parameters, a first set of stored parameters controlling a first deflection center of said beam, a second set of stored parameters controlling a second deflection center of said beam and a third set of stored parameters controlling a third deflection center of said beam, and in which said control means combines a first set of control signals generated from said first set of stored parameters with a second set of control signals generated from said second set of control parameters and a third set of control signals generated from said third set of control parameters to form a combined set of control signals that control said current supplies to deflect said beam through said at least three deflection centers.

2. A system according to claim 1, in which a first one of said at least three deflection centers is positioned to direct said beam along a first beam segment at an intermediate angle with respect to said axis and a second one of said at least three deflection centers is positioned to direct said beam from said first beam segment through a fixed point in a reference plane below said lower pair of deflector coils with a predetermined angle such that said beam intersects said focus means below said reference plane.

3. A system according to claim 1 comprising four deflection centers, in which a first one of said deflection centers is positioned to direct said beam along a first beam segment at an intermediate angle with respect to said axis, a second one of said deflection centers is positioned to direct said beam parallel to said system axis, a third one of said deflection centers is positioned to direct said beam from said second beam segment through said system axis and a fourth one of said at least three deflection centers is positioned to direct said beam along said system axis.

4. A lithography system for directing a charged particle beam on a workpiece, comprising:

a beam source for generating and directing said beam along a system axis;

a beamshaping aperture plate disposed about said system axis for impressing an initial beam shape, having an initial azimuthal angle, on said beam;

an upper pair of electrostatic deflectors including an upper x electrode and an upper y electrode disposed about said system axis below said beamshaping aperture plate and connected to first and second controllable voltage drivers;

a lower pair of electrostatic deflectors including a lower x electrode and a lower y electrode disposed about said system axis, displaced along said system axis from said upper pair of electrodes and connected to third and fourth controllable voltage drivers;

control means connected to said first and second controllable voltage drivers for controlling the amount of voltage supplied by said voltage drivers to said upper and lower pair of electrodes;

focus means for focusing said beam on said workpiece; and     input means connected to said control means for passing to said control means desired parameters; in which     said control means controls said first, second, third, and fourth voltage drivers by means of first, second, third, and fourth control signals to divide a total x voltage and a total y voltage into an upper x voltage supplied to said upper x electrode, an upper y voltage supplied to said upper y electrode, a lower x voltage supplied to said lower x electrode, and a lower y voltage supplied to said lower y electrode, in accordance with said set of stored parameters; and     said control means includes at least three sets of stored parameters, a first set of stored parameters controlling a first deflection center of said beam, a second set of stored parameters controlling a second deflection center of said beam and a third set of stored parameters controlling a third deflection center of said beam, and in which said control means combines a first set of control signals generated from said first set of stored parameters with a second set of control signals generated from said second set of control parameters and a third set of control signals generated from said third set of control parameters to form a combined set of control signals that control said current supplies to deflect said beam through said at least three deflection centers.

5. A system according to claim 4, in which a first one of said at least three deflection centers is positioned to direct said beam along a first beam segment at an intermediate angle with respect to said axis and a second one of said at least three deflection centers is positioned to direct said beam from said first beam segment through a fixed point in a reference plane below said lower pair of deflector coils with a predetermined angle such that said beam intersects said focus means below said reference plane.

6. A system according to claim 4 comprising four deflection centers, in which a first one of said deflection centers is positioned to direct said beam along a first beam segment at an intermediate angle with respect to said axis, a second one of said deflection centers is positioned to direct said beam parallel to said system axis, a third one of said deflection centers is positioned to direct said beam from said second beam segment through said system axis and a fourth one of said deflection centers is positioned to direct said beam along said system axis.

7. A charged-particle lithography system for directing a charged particle beam on a workpiece, comprising:

a charged particle beam source for generating and directing along a system axis said charged particle beam;

a beamshaping aperture plate disposed about said system axis for impressing an initial beam shape, having an initial azimuthal angle, on said beam;

an upper pair of deflector coils including an upper x coil and an upper y coil disposed about said system axis below said beamshaping aperture and connected to first and second controllable current supplies;

a lower pair of deflector coils including a lower x coil and a lower y coil disposed about a system axis, displaced along said system axis from said upper pair of coils and connected to third and fourth controllable current supplies;

control means connected to said first and second controllable current supplies for controlling the amount of current supplied by said first, second, third, and fourth current supplies by means of first, second, third, and fourth control signals to divide a total x current and a total y current into an upper x current supplied to said upper x coil, an upper y current supplied to said upper y coil, a lower x current supplied to said lower x coil, and a lower y current supplied to said lower y coil;

focus means for focusing said beam on said workpiece; and     input means connected to said control means for passing to said control means desired parameters; in which said control means includes at least three sets of stored parameters, a first set of stored parameters controlling a first deflection center of said beam, a second set of stored parameters controlling a second deflection center of said beam and a third set of stored parameters controlling an azimuthal rotation of said beam, and in which said control means combines a first set of control signals generated from said first set of stored parameters with a second set of control signals generated from said second set of control parameters to form a combined set of control signals that control said current supplies to deflect said beam through both said first and second deflection centers and to rotate said beam so that it strikes said workpiece at a final azimuthal angle.

8. A system according to claim 7, in which a first one of said first and second deflection centers is positioned to direct said beam along a first beam segment at an intermediate angle with respect to said axis and a second one of said first and second deflection centers is positioned to direct said beam from said first beam segment through a fixed point in a reference plane below said lower pair of deflector coils with a predetermined angle such that said beam intersects said focus means below said reference plane.

9. A charged particle lithography system for directing a charged particle beam on a workpiece, comprising:

a charged particle beam source for generating and directing said charged particle beam along a system axis;

a beamshaping aperture plate disposed about said system axis for impressing an initial beam shape, having an initial azimuthal angle, on said beam;

an upper pair of electrostatic deflectors including an upper x electrode and an upper y electrode disposed about said system axis below said beamshaping aperture plate and connected to first and second controllable voltage drivers;

a lower pair of electrostatic deflectors including a lower x electrode and a lower y electrode disposed about said system axis, displaced along said system axis from said upper pair of electrodes and connected to third and fourth controllable voltage drivers;

control means connected to said first and second controllable voltage drivers for controlling the amount of voltage supplied by said voltage drivers to said upper and lower pair of electrodes;

focus means for focusing said beam on said workpiece; and     input means connected to said control means for passing to said control means desired parameters; in which said control means includes at least three sets of stored parameters, a first set of stored parameters controlling a first deflection center of said beam, a second set of stored parameters controlling a second deflection center of said beam and a third set of stored parameters controlling an azimuthal rotation of said beam, and in which said control means combines a first set of control signals generated from said first set of stored parameters with a second set of control signals generated from said second set of control parameters to form a combined set of control signals that control said current supplies to deflect said beam through both said first and second deflection centers and to rotate said beam so that it strikes said workpiece at a final azimuthal angle.

10. A system according to claim 9, in which a first one of said first and second deflection centers is positioned to direct said beam along a first beam segment at an intermediate angle with respect to said axis and a second one of said first and second deflection centers is positioned to direct said beam from said first beam segment through a fixed point in a reference plane below said lower pair of deflector coils with a predetermined angle such that said beam intersects said focus means below said reference plane.

11. An apparatus for controlling a charged particle beam comprising:

a beam source for generating and directing said beam along a system axis;

a beamshaping aperture plate disposed about said system axis for impressing an initial beam shape, having an initial azimuthal angle, on said beam;

an upper pair of deflector coils including an upper x coil and an upper y coil disposed about a system axis and connected to first and second controllable current supplies;

a lower pair of deflector coils including a lower x coil and a lower y coil disposed about a system axis, displaced along said system axis from said upper pair of coils and connected to third and fourth controllable current supplies;

a set of electrostatic deflector plates disposed about said system axis between said upper and lower pairs of deflectors and connected to a controllable voltage driver;

an aperture plate, containing a lower aperture, disposed along said system axis below said lower pair of deflector coils;

a focus element having a focus element center, disposed along said system axis below said aperture plate;

control means connected to said electrostatic deflectors and to said first and second controllable current supplies for controlling the amount of current supplied by said first, second, third, and fourth current supplies by means of first, second, third, and fourth control signals to divide a total x current and a total y current into an upper x current supplied to said upper x coil, an upper y current supplied to said upper y coil, a lower x current supplied to said lower x coil, a lower y current supplied to said lower y coil, and the magnitude of voltage supplied to said set of electrostatic deflectors;

input means connected to said control means for passing to said control means desired parameters; in which said control means includes at least two sets of stored parameters, a first set of stored parameters controlling a first deflection center of said beam, a second set of stored parameters controlling a second deflection center of said beam, and in which said control means combines a first set of control signals generated from said first set of stored parameters with a second set of control signals generated from said second set of control parameters to form a combined set of control signals that control said current supplies to deflect said beam through both said first and second deflection centers and that control said set of electrostatic deflectors, whereby said beam may be initially aligned to pass through said aperture at an initial location and through said focus element center and said beam may then be deflected with respect to said aperture by said set of deflector plates.

* * * * *